(12) United States Patent
Kohl et al.

(10) Patent No.: US 8,999,629 B2
(45) Date of Patent: Apr. 7, 2015

(54) PHOTOSENSITIVE SACRIFICIAL POLYMER WITH LOW RESIDUE

(71) Applicant: Georgia Tech Research Corporation, Atlanta, GA (US)

(72) Inventors: Paul Kohl, Atlanta, GA (US); Yu-Chun Chen, Chandler, AZ (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 14/250,455

(22) Filed: Apr. 11, 2014

(65) Prior Publication Data

US 2014/0272708 A1   Sep. 18, 2014

Related U.S. Application Data

(62) Division of application No. 13/537,556, filed on Jun. 29, 2012, now Pat. No. 8,728,717.

(60) Provisional application No. 61/505,572, filed on Jul. 8, 2011.

(51) Int. Cl.
| | |
|---|---|
| G03F 7/095 | (2006.01) |
| G03F 7/004 | (2006.01) |
| G03F 7/039 | (2006.01) |
| G03F 7/16 | (2006.01) |
| G03F 7/36 | (2006.01) |
| G03F 7/38 | (2006.01) |
| G03F 7/40 | (2006.01) |
| B81C 1/00 | (2006.01) |
| H01L 21/768 | (2006.01) |

(52) U.S. Cl.
CPC ............. G03F 7/095 (2013.01); G03F 7/0045 (2013.01); G03F 7/039 (2013.01); G03F 7/168 (2013.01); G03F 7/36 (2013.01); G03F 7/38 (2013.01); G03F 7/40 (2013.01); B81C 1/00476 (2013.01); B81B 2203/0315 (2013.01); B81C 2201/0108 (2013.01); H01L 21/7682 (2013.01)

(58) Field of Classification Search
CPC ....................................................... G03F 7/095
USPC ..................................................... 430/270.1, 9
See application file for complete search history.

(56) References Cited

U.S. PATENT DOCUMENTS

| | | | |
|---|---|---|---|
| 2002/0186950 A1* | 12/2002 | Mule'et al. ..................... 385/132 |
| 2005/0191862 A1* | 9/2005 | Strane ........................... 438/758 |
| 2006/0263718 A1 | 11/2006 | Kohl et al. | |
| 2009/0107952 A1 | 4/2009 | Kohl et al. | |
| 2009/0120905 A1* | 5/2009 | Kohl et al. ...................... 216/49 |
| 2010/0167213 A1* | 7/2010 | Seino et al. ................... 430/319 |

* cited by examiner

OTHER PUBLICATIONS

Cupta, et al., Photoacid Generators for Catalytic Decomposition of Polycarbonate, Journal of Applied Polymer Science, 2007, pp. 2655-2662, vol. 105, Wiley Periodicals, Inc.

*Primary Examiner* — Brittany Raymond
(74) *Attorney, Agent, or Firm* — Balaram Gupta (57) ABSTRACT

Embodiments according to the present invention relate generally to PAG bilayer and PAG-doped unilayer structures using sacrificial polymer layers that incorporate a photoacid generator having a concentration gradient therein. Said PAG concentration being higher in a upper portion of such structures than in a lower portion thereof. Embodiments according to the present invention also relate to a method of using such bilayers and unilayers to form microelectronic structures having a three-dimensional space, and methods of decomposition of the sacrificial polymer within the aforementioned layers.

19 Claims, 9 Drawing Sheets

PHOTOSENSITIVE SACRIFICIAL POLYMER WITH LOW RESIDUE

CROSS-REFERENCE TO RELATED APPLICATIONS

This application is a divisional of U.S. application Ser. No. 13/537,556, filed Jun. 29, 2012, now allowed, which claims the benefit of U.S. Provisional Application No. 61/505,572, filed Jul. 8, 2011, both of which are incorporated herein by reference in their entirety.

TECHNICAL FIELD

The present invention relates generally to sacrificial polymer structures and more specifically to such structures encompassing one or more sacrificial polymer layers collectively having concentration gradient of a photoacid generator where such concentration is highest in a top layer of a multi-layer structure or highest at the upper region of a monolayer structure, such sacrificial polymer structures being useful in forming microelectronic structures having enclosed three-dimensional spaces.

BACKGROUND

Sacrificial polymer layers or compositions that encompass a sacrificial polymer, such as, polypropylene carbonate (PPC), and a photoacid generator are known. Typically such sacrificial polymer layers are formed overlying a substrate, by applying a sacrificial polymer composition, encompassing a sacrificial polymer and a photoacid generator (PAG), to the substrate. The resulting sacrificial polymer layer, having a uniform distribution of PAG therethrough, is then photo-patterned by first performing an imagewise exposure to actinic radiation and then removing exposed portions of the polymer layer by the thermal decomposition of such portions. This patterning is then generally followed by the forming of an overcoat layer that essentially encapsulates the remaining portions of the sacrificial polymer layer. Typically such overcoat layer is a non-sacrificial material. The overcoated, photo-patterned sacrificial polymer structure is then heated to a temperature sufficient to cause the encapsulated sacrificial polymer to decompose and further to cause decomposition products formed to pass or permeate through the overcoat layer. In this manner, a defined three dimensional enclosed space, i.e., an air cavity or air gap, is formed. While such known processes have proven effective for some applications, it has been found that (1) after decomposition, the amount of residue remaining in the enclosed space, such as from the PAG additive, could be problematic for the creation of advanced devices and/or the use of such advanced devices in both new and existing applications; and (2) that patterning such layers often results in structures having a high degree of line edge roughness (LER).

Figure 1:
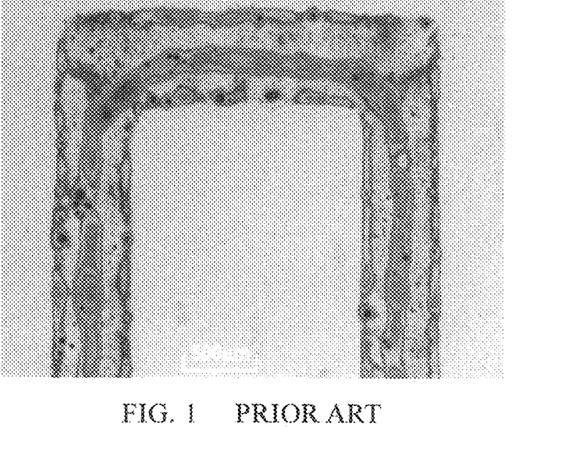
FIG. 1 is an optical image showing a top view of decomposition residue patterns of a photo-patterned PPC monolayer made in accordance with the prior art.

For example, FIG. 1 shows a top view of residue observed after the decomposition of an unencapsulated sacrificial polymer structure made in accordance with the prior art as described above. That is to say, that such structure was not overcoated prior to heating to cause decomposition. The average thickness of the residue seen was measured by scanning profilometry and calculated to be about 0.157 μm. Based on the original thickness of the structure, the thickness of the residue represents about 0.55% residue.

Figure 2:
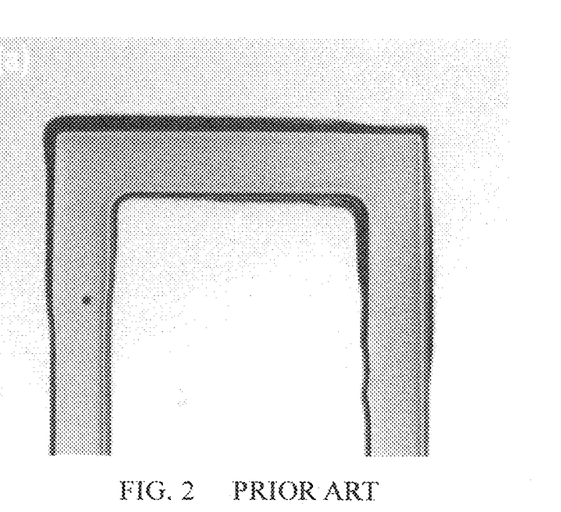
FIG. 2 is an optical image showing a top view of a photo-patterned PPC monolayer made in accordance with the prior art showing a high degree of LER.

Referring now to FIG. 2, which shows a top view of a photo-patterned sacrificial polymer structure, prior to encapsulation, made in accordance with the prior art. As seen, there is significant non-uniformity of the width for the vertical lines which is often referred to as line edge roughness (LER). Additionally, significant variation in the thickness of the dark peripheral regions can be observed, which are due to diffusion of the acid created by activation of the PAG into the unexposed region. One of skill in the art will recognize these variations as an indication of variations in the slope of the sidewalls of the feature shown; thicker dark regions being indicative of a more sloped sidewall.

Further, as presently known sacrificial polymer layers having the aforementioned uniform distribution of PAG therethrough encompass high total amounts of PAG additive, such layers are generally highly absorbing of the actinic radiation required for PAG activation. Thus the high radiation doses needed can also be problematic as they lead to long exposure times which can adversely affect manufacturing throughput.

Thus, as the amount of residue, degree of LER observed and long exposure times needed for PAG activation for known sacrificial polymer layers made by known methods can be problematic, it would be desirable to develop sacrificial polymer layers and methods for forming and decomposing such layers that address the aforementioned deficiencies

BRIEF DESCRIPTION OF THE DRAWINGS

Embodiments in accordance with the present invention are described below with reference to the following accompanying figures and/or images. Where drawings are provided, it will be drawings which are simplified portions of a device provided for illustrative purposes only.

FIG. 6b is the profile of the bottom array of FIG. 6a;

FIG. 7b is the profile of the bottom array of FIG. 7a;

DETAILED DESCRIPTION

Exemplary embodiments in accordance with the present invention will be described with reference to the Examples and Claims provided hereinafter. Various modifications, adaptations or variations of such exemplary embodiments described herein may become apparent to those skilled in the art as such are disclosed. It will be understood that all such modifications, adaptations or variations that rely upon the teachings of the present invention, and through which these teachings have advanced the art, are considered to be within the scope of the present invention.

As used herein, the articles "a," "an," and "the" will be understood to include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

As used herein, molecular weight values of polymers, such as weight average molecular weights ($M_w$) and number average molecular weights ($M_n$), are determined by gel permeation chromatography using polystyrene standards.

As used herein, polydispersity index (PDI) values will be understood to represent a ratio of the weight average molecular weight ($M_w$) to the number average molecular weight ($M_n$) of the polymer (i.e., $M_w/M_n$).

As used herein, and unless otherwise stated, polymer decomposition temperatures will be understood to mean the temperature, as determined by thermogravimetric analysis at a heating rate of 0.5° C./minute, where a specific weight percent (wt. %) of a polymer has decomposed into gaseous decomposition products. Therefore the terms $T_{d5}$, $T_{d50}$ and $T_{d95}$ will be understood to indicate the temperatures at which 5 wt. %, 50 wt. % and 95 wt. % of the polymer has decomposed.

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all subranges subsumed therein. For example, a stated range of from "1 to 10" should be considered to include any and all subranges between the minimum value of 1 and the maximum value of 10. Exemplary subranges of the range 1 to 10 include, but are not limited to, 1 to 6.1, 3.5 to 7.8, and 5.5 to 10.

As used herein, the terms "photoacid generator" (PAG) and "photoinitiator" will be understood to mean a material that generates one or more acids, including but not limited to protonic acids, after exposure to an appropriate amount of actinic radiation provided at an appropriate wavelength.

As used herein, the terms "decomposable" and "decomposed", or similar terms, mean that the sacrificial polymer can be or has been at least partially broken down into smaller units each having a molecular weight less than the molecular weight of the sacrificial polymer prior to its being decomposed. Such smaller units include, but are not limited to: oligomers of the sacrificial polymer, the monomers from which the sacrificial polymer was derived and fragments thereof. For example, where the sacrificial polymer is polypropylene carbonate (PPC) such smaller units can encompass hydroxyl-terminated polycyclic carbonate oligomers, polycyclic carbonates, polycyclic ethers, and/or cyclic carbonates, CO and/or $CO_2$.

As used herein, the term "PAG monolayer" means a sacrificial polymer layer formed, in accordance with the prior art, from a PAG loaded sacrificial polymer composition encompassing a sacrificial polymer, a photoacid generator and a solvent, where the polymer is from 10 to 30 wt. % of the composition, and the PAG is from 3 to 10 wt. % of the polymer. The PAG monolayer formed being self-photo-definable.

As used herein, the term "PAG bilayer" means a sacrificial polymer layer formed, in accordance with embodiments of the present invention, from at least two distinct sacrificial polymer compositions. A first of such distinct polymer compositions for forming a first sacrificial polymer layer, such first composition encompassing a sacrificial polymer and a solvent but where such composition is absent any PAG, and a second of such distinct polymer compositions for forming a second sacrificial polymer layer overlying the first sacrificial polymer layer, such second composition encompassing a sacrificial polymer layer and solvent and also having a desirable concentration of an appropriate PAG. Thus such PAG bilayer has, collectively, a concentration gradient of a photoacid generator therethrough. For example, considering a PAG bilayer formed from the aforementioned first and second distinct sacrificial polymer compositions where said second composition is disposed over the layer formed from said first composition, the PAG concentration will be higher in the portion of said PAG bilayer that is formed, primarily, from said second distinct composition than in the portion of the PAG bilayer formed, primarily, from said second distinct composition. Hence it can be seen that such PAG bilayer, collectively, a photoacid generator concentration gradient.

As used herein, the terms "PAG unilayer" or "PAG-doped unilayer" mean a sacrificial polymer layer formed in accordance with embodiments of the present invention, where such layer is first formed on a substrate from a sacrificial polymer composition encompassing a sacrificial polymer and a solvent but where such composition is absent any PAG. After such first forming, a PAG solution, encompassing an appropriate PAG and an appropriate solvent is disposed over the sacrificial polymer layer such that a concentration gradient of the PAG is created within such first formed layer where the concentration of PAG is higher at an upper portion of such first formed layer than at a lower portion of such first formed layer proximate a substrate upon which the PAG-doped unilayer is formed.

Thus it can be seen that both PAG bilayer and PAG unilayer embodiments of the present invention encompass a PAG concentration gradient where at least one region of such layers have a sufficient concentration of PAG to cause polymer decomposition upon activation actinic radiation. Advantageously, however, the total PAG loading of such layers is less than that of the PAG monolayer of the prior art.

The features that characterize embodiments of the present invention are pointed out with particularity in the claims. These and other features of such embodiments, their operating advantages and uses will be more fully understood from the description of such embodiments herein below.

Some embodiments in accordance with the present invention encompass PAG bilayers and structures formed therefrom, while other embodiments in accordance with the present invention encompass PAG-doped unilayers and structures formed therefrom. As such embodiments are discussed hereinafter, they will refer to a polypropylene carbonate (PPC) sacrificial polymers. It will be understood that the use of PPC in such discussions is not meant to limit the scope of the present disclosure with regard to useful sacrificial polymers, as other sacrificial polymers can be employed. For example, polynorbornene, polycaprolactone (PCL) and other polycarbonates are suitable sacrificial polymers for the embodiments of the present invention, and the choice of a particular sacrificial polymer should be recognized as a design choice. Rather, limiting the present disclosure to PPC has been done only for ease of disclosure and understanding of embodiments of such PAG bilayers.

PAG bilayer structures in accordance with embodiments of the present invention are formed by first applying a first sacrificial polymer composition over a substrate, where such first composition is absent any photoacid generator or photoinitiator, to form a first sacrificial polymer layer. Once such first layer is formed, a second sacrificial polymer composition is applied over such first layer to form a second sacrificial polymer layer, where such second composition encompasses a desirable concentration of a photoacid generator that is equal to or greater than 0.1 wt % of the sacrificial polymer. Given that the first sacrificial polymer layer was formed absent any PAG and that the second sacrificial polymer layer is formed with a desirable PAG concentration, it can be said that collectively such first and second sacrificial polymer layers form a PAG bilayer embodiment that has a concentration gradient of a photoacid generator therethrough. That is to say that the concentration of PAG is highest in the upper portion of the PAG bilayer structure and, initially, lowest at the layer's lower portion, proximate to an interface with the substrate upon which it was formed. The net result of such a PAG bilayer structure is that the peak concentration of PAG is at a level sufficient for efficient PPC decomposition is provided in one portion of the layer and not, as in the prior art PC monolayer, throughout the layer. Surprisingly, it has been found that such structures can be readily decomposed at temperatures that are essentially unchanged from the decomposition temperatures of layers made in accordance with the prior art. Not wishing to be bound by theory, it is believed that this result is achieved because the acid created from the irradiated PAG acts like a catalyst (is regenerated in PPC decomposition process and not consumed), and thus as portions of a PAG bilayer or PAG unilayer decompose an effective concentration of such acid can be maintained in proximate portions due to the aforementioned regeneration and/or diffusion of such acids into portions having lower acid concentrations. Thus, as the total PAG loading of PAG bilayers and PAG unilayers is lower than that of the prior art PAG monolayer, the amount of residue related to PAG loading is greatly reduced.

Figure 3:
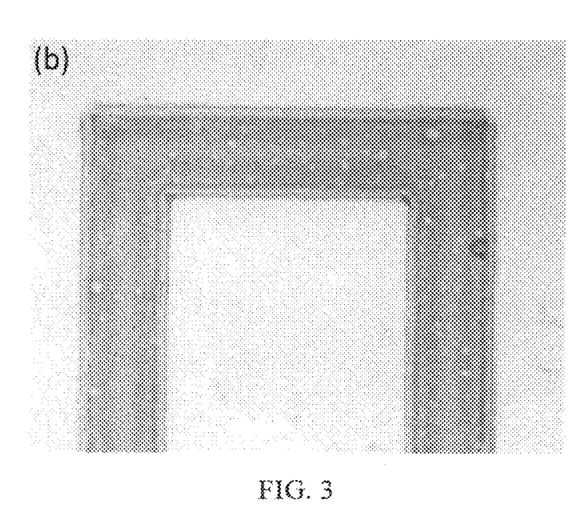
FIG. 3 is an optical image showing a top view of decomposition residue patterns of a photo-patterned PPC PAG bilayer of an embodiment in accordance with the present invention.
Figure 4:
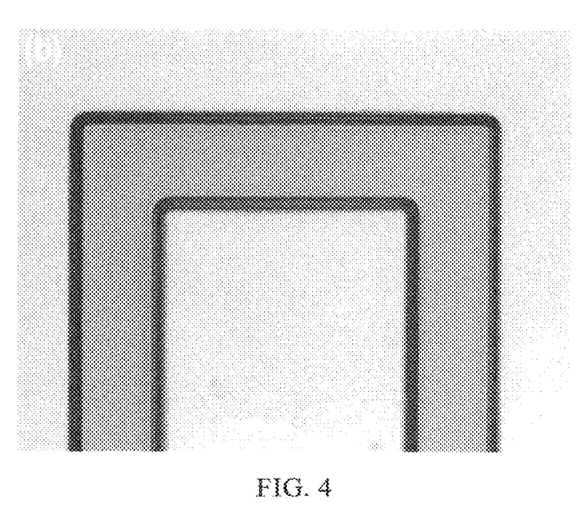
FIG. 4 is an optical image showing a top view of a photo-patterned PPC PAG bilayer of an embodiment in accordance with the present invention showing minimal LER.

Advantageously, these PAG bilayer structure embodiments can be photo-patterned with a degree of observed Line Edge Roughness (LER) much improved over what has been previously known, and upon decomposition, leave significantly less residue remaining than what has been previously known. Such advantages are shown by the comparison of FIGS. 3 and 4, representative of embodiments in accordance with the present invention, and previously discussed FIGS. 1 and 2, representative of the prior art. Referring first to a comparison of FIGS. 1 and 3, a significant reduction in the amount of residue present after decomposition of the sacrificial polymer is seen in FIG. 3 as compared the residue seen in FIG. 1. The average thickness of the residue seen in FIG. 3 was measured in the same manner as was discussed for FIG. 1 and calculated to be about 0.059 µm. Based on the original thickness of the structure, the thickness of the residue seen in FIG. 3 represents about 0.19% residue, thus showing only about ⅓ the residue seen in FIG. 1. Turning to a comparison of FIGS. 2 and 4, it can be seem that the degree of LER present in FIG. 4 is minimal and thus greatly reduced from what is seen in FIG. 2.

Thus PAG bilayer embodiments in accordance with the present invention provide for the decomposition of a sacrificial polymer that provides little or no residue and a few low degree of LER. Thus it will be understood that such embodiments are useful to create air cavities or air-gaps that are much improved over structures made using previously known sacrificial polymer layers and methods. Further, air cavities formed in accordance with embodiments of the present invention are capable of extending the usage of such structures to sub-micrometer and nanometer-scale devices such as fluidic channels, microelectromechanical system (MEMS) packaging, and as low-K dielectric structures for advanced microelectronic devices.

It will further be understood that any reference to PAG bilayer structures is not limited to structures form from only two distinct sacrificial polymer compositions. Rather, it will be understood that such PAG bilayer structures are formed from at least two distinct compositions and therefore embodiments in accordance with the present invention are also inclusive of PAG bilayer structures formed from more than two sacrificial polymer compositions. Still further, it will be understood that regardless of the number of distinct polymer compositions used to form such a PAG bilayer structure or film, that once formed such a film is a monolithic structure. That is to say, that other than for the aforementioned PAG concentration gradient, such PAG bilayer film does not display an interface or characteristics of an interface between any of the applied sacrificial polymer compositions used to create such PAG bilayer film.

Figure 5:
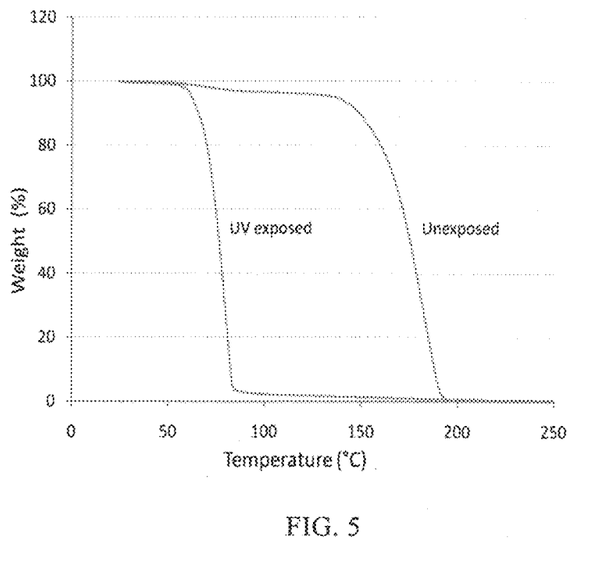
FIG. 5 is a dynamic thermogravimetric analysis (TGA) plot of a photoacid generator (PAG) loaded-polycarbonate (PPC) layer formed in accordance with the prior art, a PPC monolayer, with and without UV exposure.

Referring now to FIG. 5, thermogravimetric analysis plots of both exposed and unexposed PAG monolayers show that the $T_{d50}$ of exposed PAG loaded polypropylene carbonate (PPC) is about 80° C. while the $T_{d50}$ of the unexposed PAG loaded PPC is about 170° C. Thus it will be understood that subjecting such layers to an image-wise exposure, that is to say an exposure to actinic radiation through a masking element, that exposes only some portions of the layer and hence generate therein the protonic acid(s) that can cause the decomposition temperature lowering seen in FIG. 5 will occur only in such exposed portions. Further, it will be understood that heating the layer to a temperature at or above the decomposition temperature of an exposed portion, but below the decomposition temperature of an unexposed portion, will result in the decomposition of such exposed portions to create a structure representative of the image of the masking element.

While FIG. 5 presents data for a PAG loaded PPC material, that is to say a PPC material having from 3 to 10 wt. % of a PAG, it has been found that such decomposition temperature lowering is also observed for PAG bilayers. Without wishing to be bound by theory, it is believed that in the PAG bilayer structure, upon exposure to an appropriate wavelength of actinic radiation, the portion of bilayer formed from the first distinct polymer composition that is absent PAG loading serves as a "diffusion sink" for any acids formed from the PAG of the portion of the bilayer structure formed from the aforementioned second distinct sacrificial composition that does have PAG loading. Thus sufficient local acid concentration can be provided through the entire bilayer structure to allow for an essentially uniform lowering of an exposed portion's decomposition temperature. The only observed difference in the decomposition process of a PAG monolayers of the prior art and a PAG bilayer of equivalent thicknesses being that additional time is needed for the local concentration of PAG to diffuse to the PAG-poor regions to obtain essentially complete decomposition of the bilayer. For example, exposed portions of an about 30 µm PAG monolayer are decomposed in about 4-5 minutes, while exposed portions of a PAG bilayer, of essentially the same thickness, are decomposed in about 13-15 minutes. It is further believed that the "diffusion sink" effect is also a contributor to the improvement in line edge roughness seen, for example, in the comparison of FIGS. 2 and 4. Further to the aforementioned theory, it is believed that the presence of the "diffusion sink" limits lateral diffusion of the aforementioned acid(s) generated by the PAG in exposed regions to adjacent unexposed regions to create the degree of LER observed in FIG. 2.

Figure 6A:
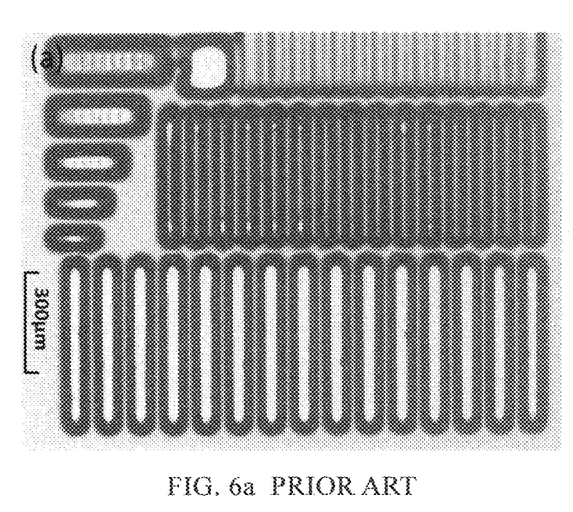
FIG. 6a is an optical image showing a top view of a resolution test pattern image formed in a PPC monolayer, made in accordance with the prior art, having a variety of line and space dimensions, the bottom array having a nominal 50 μm spacing.
Figure 6B:
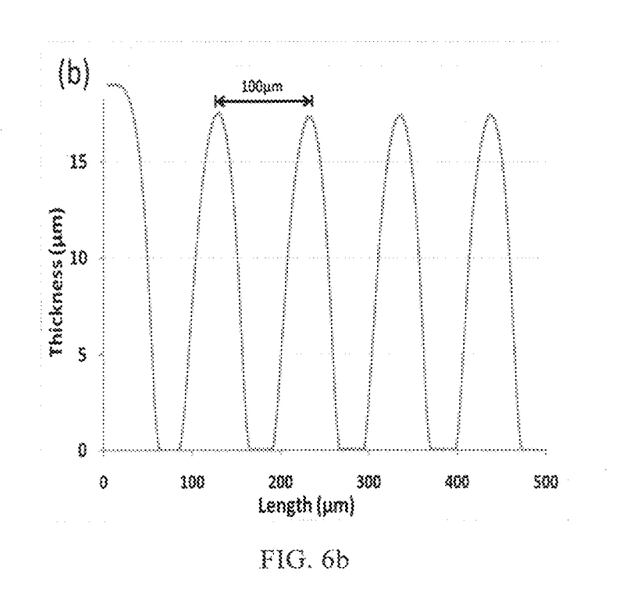
Figure 7A:
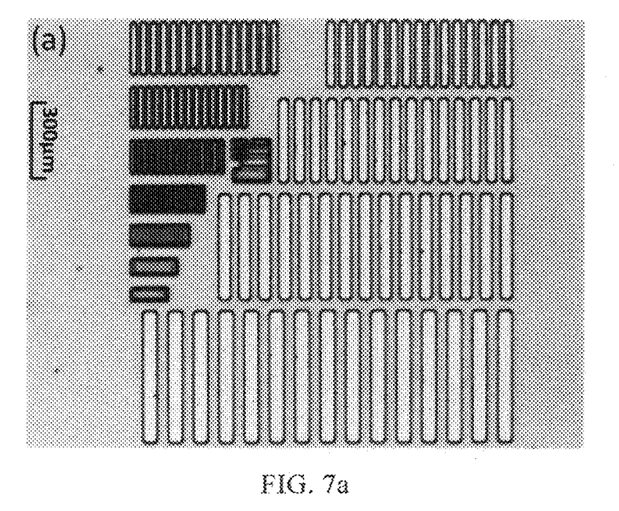
FIG. 7a is an optical image showing a top view of a resolution test pattern image formed in a PPC PAG bilayer, made in accordance with an embodiment of the present invention, having a variety of line and space dimensions, the bottom array having a nominal 50 μm spacing.
Figure 7B:
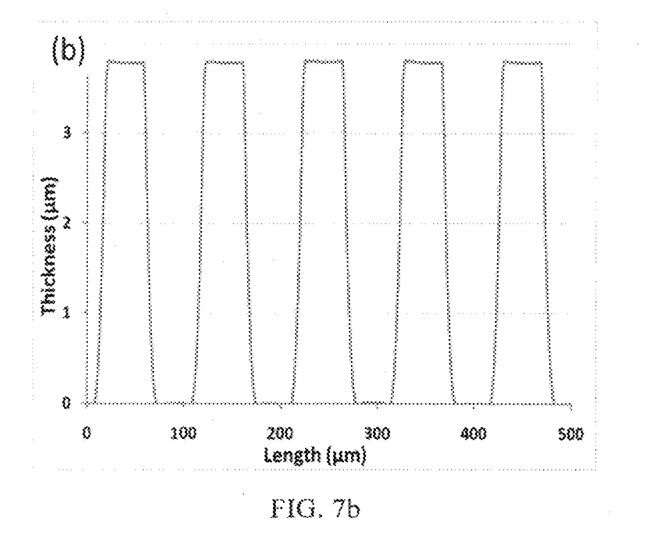

Advantageously, such limited lateral diffusion results in improved spatial resolution, i.e., better resolution of an expected dimension and essentially vertical sidewall profiles. Referring now to FIGS. 6a and 7a, each show a resolution test pattern imaged in a PAG monolayer (6a) and a PAG bilayer (7a). FIGS. 6b and 7b show a plot of the profiles of a portion of the 50 µm line and space bottom array of FIGS. 6a and 7a, respectively. As it is readily seen, the resolution of test pattern features shown in FIG. 7a is superior to that shown in FIG. 6a; additionally, the profiles of FIG. 7b show sidewall profiles that are significantly more vertical than those of FIG. 6b. Thus demonstrating the improved imageability of a PAG bilayer embodiment of the present invention to that of a PAG monolayer made in accordance with the previously known art.

Figure 8A:
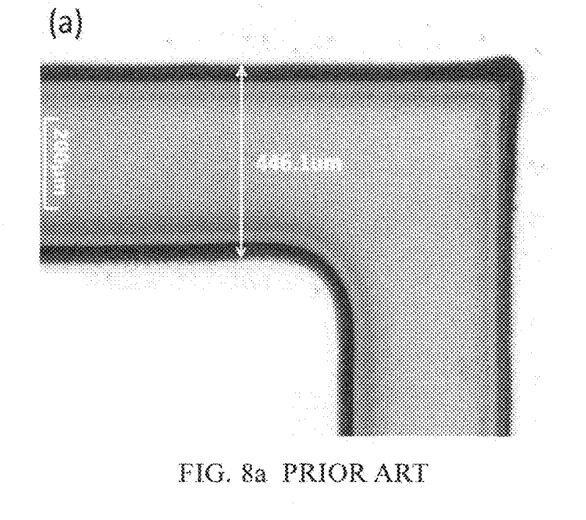
FIG. 8a is an optical image showing a top view and dimension of a photo-patterned PPC monolayer made in accordance with the prior art.
Figure 8B:
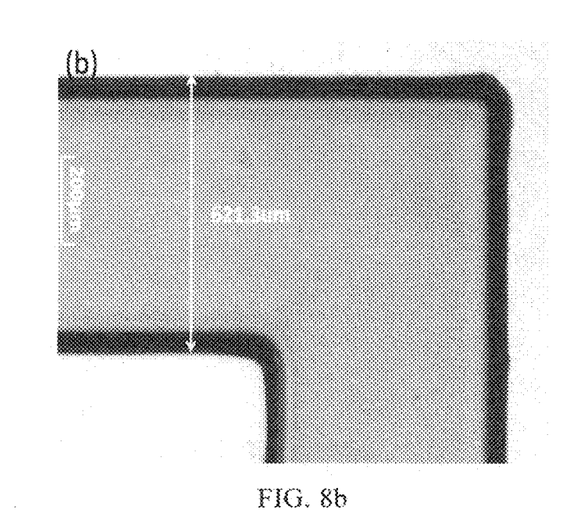
FIG. 8b is an optical image showing a top view and dimension of a photo-patterned PPC PAG bilayer made in accordance with an embodiment of the present invention.

Turning now to FIGS. 8a and 8b, another comparison of imageability between a prior art PAG-monolayer (8a) and a PAG bilayer (8b) embodiment of the present invention is shown. While the line width dimension of the photo mask used for the imagewise exposure of each layer was 600 µm, the measured line width of the PAG-monolayer (8a) is shown to be 446 µm while the measured line width of the PAG-bilayer is shown to be 621 µm. For each image the same exposure time and energy and image development methods were employed (other than an extended decomposition time for the bilayer), thus it follows that the different results obtained where a function of the difference between a sacrificial layer of the prior art and a bilayer made in accordance with the present invention, FIGS. 8a and 8b, respectively.

Figure 9:
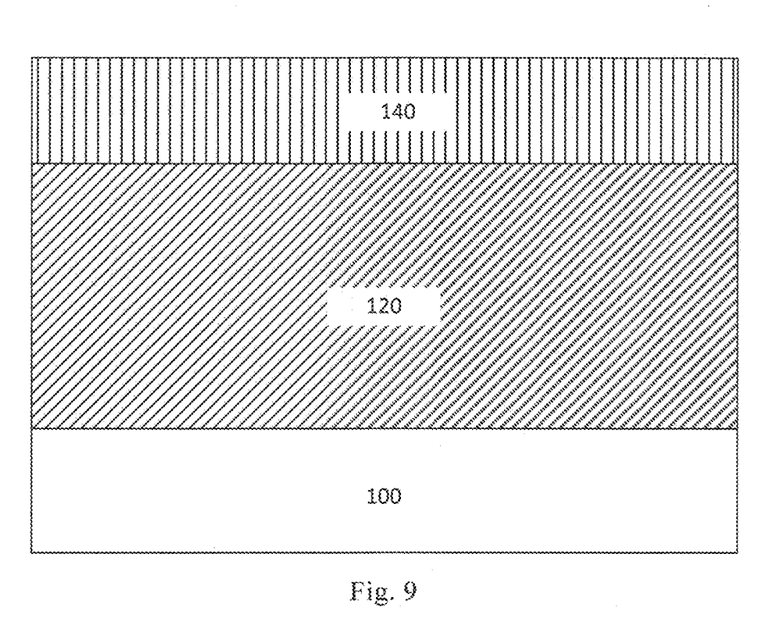
FIG. 9 is a simplified schematic cross-sectional view of a portion of a PAG bilayer structure embodiment in accordance with the present invention.

Now referring to FIG. 9, a simplified schematic cross-sectional view of a portion of a PAG bilayer structure embodiment in accordance with the present invention is shown. Such bilayer structure is formed overlying substrate 100 by first forming a first sacrificial polymer layer 120 absent any PAG over substrate 100 from the aforementioned first distinct sacrificial polymer composition and after drying the resulting film or layer, forming a second sacrificial layer 140 from the aforementioned second sacrificial polymer composition over sacrificial polymer layer 120. It will be understood, that as shown in Table 1, the thicknesses of both layer 120 and layer 140 can be varied to obtain a desired result.

Figures 10A, 10B:
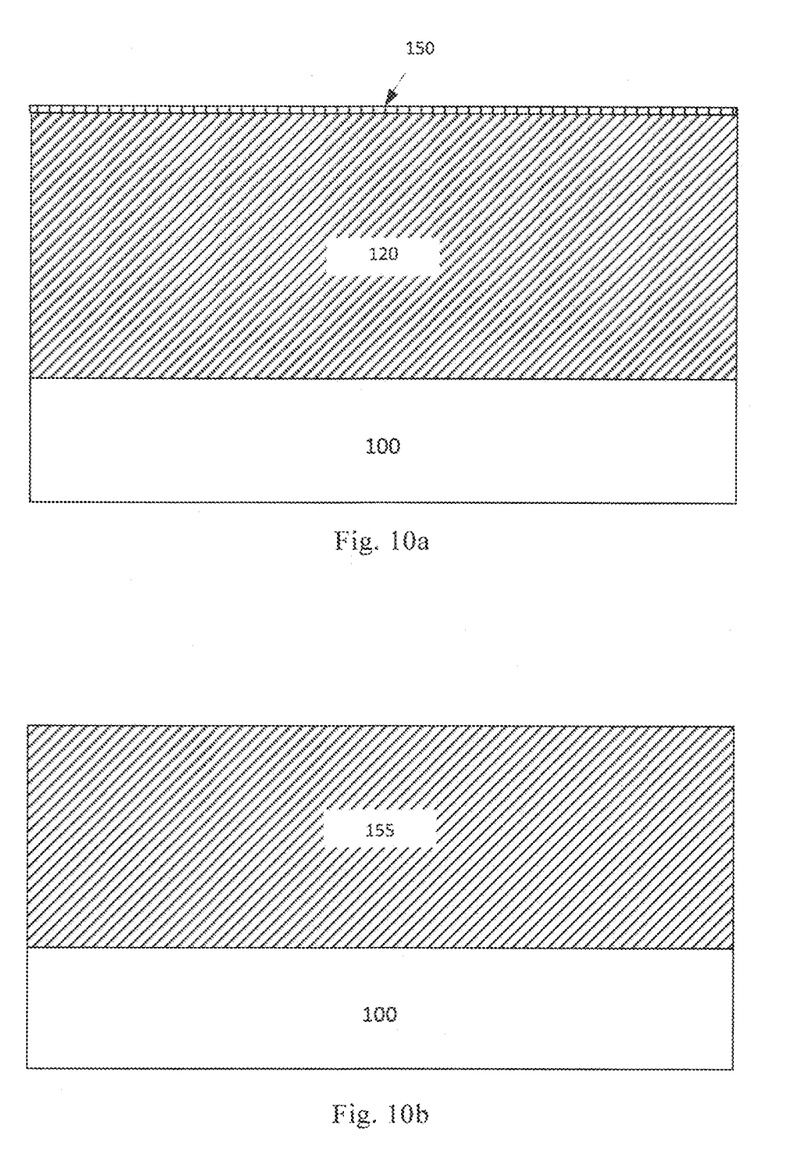
FIGS. 10A-10B are simplified schematic cross-sectional views of a portion of a device formed using a method embodiment of the present invention, that employs a PAG bilayer for forming an air gap structure.

Some embodiments in accordance with the present invention encompass a PAG unilayer rather than the aforementioned PAG bilayer. Referring to FIGS. 10a and 10b, such PAG-doped unilayer are formed overlying substrate 100 by first forming sacrificial polymer layer 120, as described above, over substrate 100. After layer 120 is formed and dried by a soft bake, such layer is treated with a PAG loaded solution 150. PAG solution 150 consisting of a solvent and a PAG and being absent any sacrificial polymer. It will be understood that while polymer layers 120 and 140 are generally formed by a processes such as spin coating, spray coating, doctor blading and the like, treatment with PAG loaded solution 150 can also encompass immersion of layer 120 in such solution for a desired period of time. After such the initial treatment with solution 150, the layer and substrate is again subjected to a soft bake and PAG-doped unilayer 155 (FIG. 10b) is created.

As previously mentioned, it will be understood that the sacrificial polymer employed to form PAG bilayer and PAG unilayer embodiments of the present invention is not limited to polypropylene carbonate (PPC). Other polycarbonates such as polyethylene carbonate (PEC), polycyclohexane carbonate (PCC), polycyclohexanepropylene carbonate (PCPC), polynorbornene carbonate (PNC), and combinations thereof. Still further, such embodiments can also be formed using sacrificial polymers such as poly[(oxycarbonyloxy-1,1,4,4-tetramethylbutane)-alt-oxycarbonyloxy-5-norbornene-2-endo3-endo-dimethane)]; poly[(oxycarbonyloxy-1,4-dimethylbutane)-alt-(oxycarbonyloxy-5-norbornene-2-endo-3-endo-dimethane)]; poly[(oxycarbonyloxy-1,1,4,4-tetramethylbutane)-alt-(oxycarbonyloxy-p-xylene)]; and poly[(oxycarbonyloxy-1,4-dimethylbutane)-alt-(oxycarbonyloxy-p-xylene)], among others.

Additionally, such sacrificial polymers can be provided for forming the PAG bilayer and PAG unilayer embodiments in accordance with the present invention having a range of useful molecular weights. Thus for some embodiments, the sacrificial polymers can have weight average molecular weights (Mw) of from 2,000 to 200,000, while for other embodiments a Mw range of 8,000 to 70,000 is appropriate, and for still other embodiments a range of from 9,000 to 60,000 is appropriate.

As previously discussed and as shown in FIG. 9, PAG bilayer and PAG-doped unilayer embodiments of the present invention encompass at least one photo acid generator moiety or PAG. Generally such PAGs are selected from materials that encompass a triflic acid group, a nonaflic acid group, a FABA acid group or a non-fluorinated sulfonate acid group. More specifically, useful PAGs include but are not limited to (tert-butoxycarbonylmethoxynaphthyl)-diphenylsulfonium triflate (TBOMDS-TF), bis(4-tert-butylphenyl)iodonium triflate (BTBPL-TF), N-hydroxynaphthalimide triflate, diphenyliodonium perfluoro-1-butanesulfonate (NHN-TF), tris(4-tert-butylphenyl)sulfonium perfluoro-1-butanesulfonate (DPI-NF), n-hydroxynaphthalimide perfluoro-1-butanesulfonate (TTBPS-NF), 4-methylphenyl[4-(1-methylethyl)phenyl]iodonium tetrakis(pentafluorophenyl)borate (Rhodorsil-FABA), tris(4-tert-butylphenyl)sulfonium tetrakis-(pentafluorophenyl)borate (TTBPS-FABA), triphenylsulfonium tetrakis-(pentafluorophenyl)borate (TPS-FABA), bis(4-tert-butylphenyl)iodonium p-toluenesulfonate (BT-BPI-PTS), diphenyliodoniurn 9,10-dimethoxyanthracene-2-sulfonate (DPI-DMOS), Ciba non-ionic photoacid generator (CGI-263), bis(4-tert-butylphenyl)iodonium tris(perfluoromethanesulfonyl)methide (BTBPI-TMM), bis(4-tert-butylphenyl)iodonium bis(perfluorobutanesulfonyl)imide (BT-BPI-BBI), bis(4-tert-butylphenyl)iodonium perfluoro-1-octanesulfonate (BTBPI-HDF) and combinations thereof.

The polymer compositions used to form the bilayer embodiments of the present invention are generally solutions of an appropriate sacrificial polymer and an appropriate PAG(s). While polymer concentration of some of such composition embodiments in accordance with the present invention can range from 5% to 50% wt. % (based on the total weight of the composition), other composition embodiments have a polymer concentration of from 5 to 35 wt. % while in still other embodiments the polymer concentration ranges from 10 to 20 wt. %. It will be understood that the polymer concentration employed in these aforementioned embodiments is generally selected to allow the formation of a layer of film having a specific thickness and is therefore considered to be a design choice.

As it should also be understood, the concentration of PAG that is employed is not arbitrary, but rather is a function of whether PAG loaded polymer composition or a PAG solution is employed, the specific PAG or PAGs selected, their ability to form protonic acids having sufficient strength to force the decomposition of the specific sacrificial polymer or polymers that have been selected. Therefore, like the concentration of polymer discussed above, the concentration of PAG employed is also a design choice. That being said, for some embodiments according to the present invention, the photo-acid generator concentration can be present in amounts of from 0.2 to 6 wt. %, or from 3 to 20 wt. % where such ranges are based on the weight of polymer present in the polymer composition used to form the desired layer(s) or the solution weight where a PAG solution is employed. For other embodiments the PAG concentration in such compositions can range from 4 to 18 wt. % and for still other embodiments from 5 to 15 wt %.

As mentioned above, the polymer composition embodiments in accordance with the present invention are solutions and therefore encompass a solvent. Again as discussed above with regard to a choice of polymer and PAG(s), the choice of solvents is also a design choice, however this choice can only be effective if the selected solvent(s) are appropriate for forming a solution of the selected sacrificial polymer(s) and/or PAG(s). Exemplary solvents include, but are not limited to, acetonitrile, acetophenone, alpha-angelicalactone, anisole, gamma-butyrolactone, N-butyl acetate, cyclohexylbenzene, cyclohexanone, cyclopentanone, decahydronaphthalene, diethylene glycol dimethyl ether, N,N-dimethylacetamide, N,N-dimethylformamide, ethyl 3-ethoxypropionate, ethyl lactate, 2-heptanone, methyl isobutyl ketone, mesitylene, 2-methoxyethyl ether, 1-methyl-2-pyrrolidinone, 2-methyltetrahydrofuran, methyl tetrahydrofurfuryl ether, gamma-octanoic lactone, propylene carbonate, propylene glycol monomethyl ether acetate, propylene glycol monomethyl ether, 1,2,3,4-tetrahydronaphthalene, and combinations thereof.

Where a PAG-doped unilayer is formed, the solvent employed to make the PAG-loaded solution 150 (FIG. 10) can be the same or different from the solvent of the sacrificial polymer composition used to form sacrificial polymer layer 120. It should be understood that as solution 150 does not encompass a sacrificial polymer, the treatment of layer 120 is likely to reduce the initial thickness of such layer. Such thickness reduction being a function of solubility of the polymer of layer 120 in the solvent employed for solution 150. Thus where a specific final thickness of the PAG-doped unilayer 155 is desired, the initial thickness of layer 120 should be adjusted for such loss of thickness due to its treatment with solution 150. Such thickness reduction being a function of the solvent used for solution 150 and the method of the treatment employed, the adjustment of the initial thickness of layer 120 can be readily determined without undue experimentation.

Table 1, below, illustrates a series of experiments that were performed to determine the effect of changing the thickness of the PAG monolayer in PAG bilayer embodiments. Further, for each experiment, both a full thickness PAG monolayer and a PAG bilayer were formed, portions of each layer received the essentially equivalent UV exposure and then subjected to the same pattern development and decomposition conditions. Further, in all cases the PAG loading of the PAG monolayer was 3 wt. % of the weight of the polymer. Where % residue reduction is reported for each PAG bilayer structure, the value reported was calculated from the average (ave.) thickness of the residue found after decomposition of the sacrificial polymer by the following equation:

$$\% \text{ Residue Reduction} = [1-(\text{ave. bilayer residue/ave. monolayer residue})]*100$$

Thus in Experiment 1, a 62.5% reduction in residue was found, while as the thickness of the PAG monolayer portion of the PAG bilayer was reduced, the % residue reduction increased, reaching 74% in Experiment 3. While it should be observed that the width of the bilayer pattern increased by about 7% between Experiment 1 and Experiment 3, the width of the monolayer pattern increased by about 6%. Viewing the monolayer results as an "internal control", the change in pattern width is believed not directly related to the decreasing thickness of the PAG monolayer portion of each PAG bilayer.

It will of course be understood that as the amount of residue remaining is believed to result from nonvolatile PAG(s), therefore it will be understood that overall PAG loading of each of the bilayers should be indicative of the % residue reduction. Such a result is indeed found and disclosed in Table 1.

In the Table 1 below, where presented, the monolayer is representative of the prior art PAG-monolayer as described above, the bilayer is representative of the PAG-bilayer as described above, the values for Total Film Thickness, Final Pattern Thickness, and Final Pattern Width are expressed in µm, the value of UV exposure time as seconds (sec), the value for Average (Avg.) Residue is expressed in Angstroms (Å). The values for % Residue Reduction are calculated using the previously presented formula.

TABLE 1

| Sample | Total Layer Thickness† | | UV Exposure Time | Final Pattern Thickness | Final Pattern Width† | Avg. Residue Thickness | % Residue Reduction |
|---|---|---|---|---|---|---|---|
| Monolayer 1 | 32.2 | | 320 | 28.5 | 446.1 | ~1600 | |
| Bilayer 1 | 32.7 | 6.3* | 320 | 30.6 | 621.3 | ~600 | 62.5 |
| Monolayer 2 | 29.9 | | 310 | 29.5 | 454.5 | ~1600 | |
| Bilayer 2 | 30.6 | 5.1* | 310 | 30.3 | 659.5 | ~560 | 65.0 |

TABLE 1-continued

| Sample | Total Layer Thickness† | UV Exposure Time | Final Pattern Thickness | Final Pattern Width† | Avg. Residue Thickness | % Residue Reduction |
|---|---|---|---|---|---|---|
| Monolayer 3 | 28.6 | | 290 | 28.3 | 472.7 | ~1400 | |
| Bilayer 3 | 28.6 | 2.7* | 30 | 28.2 | 667.8 | ~360 | 74.0 |

†All thickness and width values are expressed as μm
*The thickness of the PAG-loaded PPC layer of the PAG-bilayer structure.

In summary, while typically a minimum of 3 wt. % PAG loading is required for a sacrificial polymer such as PPC to be directly photo-imagable, where the exposed portions of the sacrificial structure is removed through a decomposition step, it has been found that by creating a multilayer structure where at least one of such layer is absent any PAG, such a structure can be directly photo-patterned by the removal of exposed portions of the multi- or bilayer structure via a polymer decomposition step. It should be noted that by limiting the PAG to only some portion(s) of such a structure, the overall PAG loading is reduced. Thus in Table 1, above the PAG loading of Bilayer 1 is, in total, 0.58% while for Bilayer 3 the PAG loading is 0.09%. Advantageously, while the overall PAG loading is greatly reduced it is noteworthy that the imageability of bilayer embodiments in accordance with the present invention is excellent. Thus where for Bilayer 3 the amount of energy used to expose portions of such bilayer was reduced to 1/10 that used for the exposure of Bilayer 1 or 2, patterning was successful and the % remaining residue greatly reduced.

It should also be noted that while much of the data presented hereinabove has discussed and shown the decomposition of an unencapsulated sacrificial polymer, some embodiments in accordance with the present invention encompass encapsulating unexposed portions of a bilayer with an overcoat layer or material. Such overcoat material selected to be thermally stable at the temperature selected for the decomposition of the unexposed sacrificial portions as well as being able to allow for the permeation of the decomposition products therethrough. Such overcoat materials can be polymers with an appropriately high decomposition temperature, for example a polynorbornene polymer such as an AVATREL® material available from Promerus, LLC, Brecksville Ohio, or alternatively an inorganic material such as a silicon dioxide or silicon oxynitride layer formed in a manner appropriate to avoid the premature decomposition of the unexposed bilayer portion.

It will be understood that "permeation" or "permeate through" refers to the known process of dissolution of moieties into a membrane or film, diffusion of such dissolved moieties through such film, and evaporation of such moieties form such film or membrane.

Figure 11A:
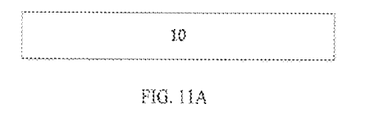
FIGS. 11A-11G are simplified schematic cross-sectional views of a portion of a device formed using another method embodiment of the present invention, that employs a PAG-doped unilayer, in accordance with the present invention for forming an air gap structure.
Figure 11B:
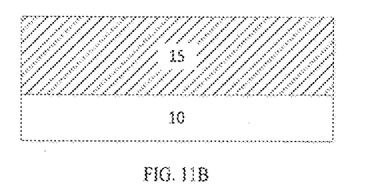
Figure 11C:
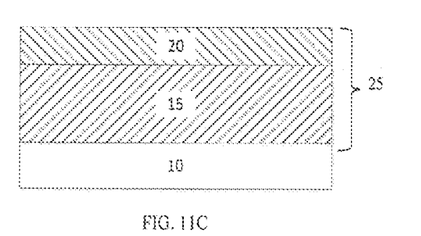
Figure 11D:
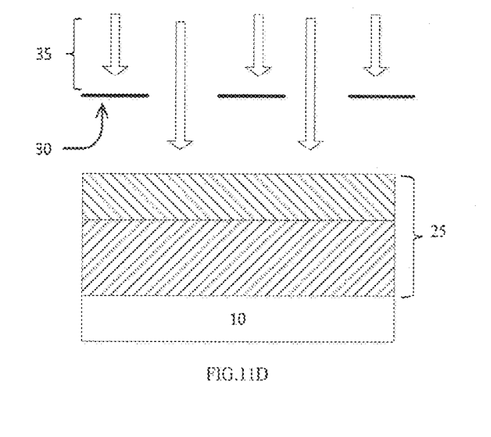
Figure 11E:
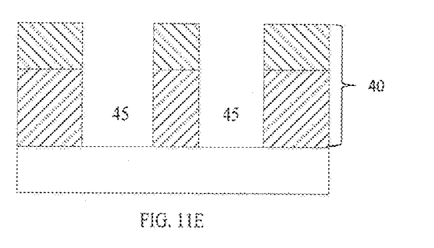
Figure 11F:
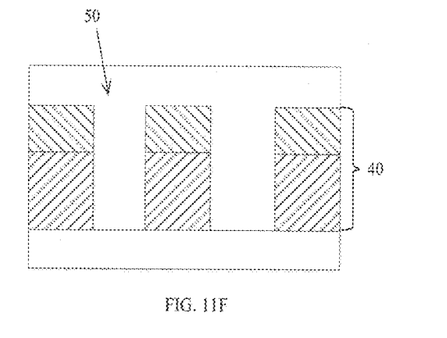
Figure 11G:
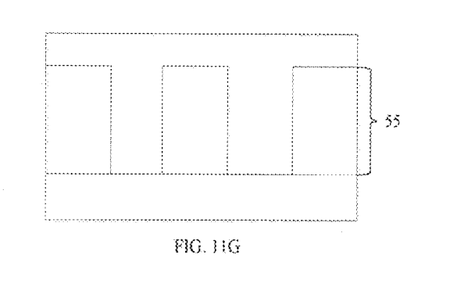

Turning mow to FIGS. 11A-11G, a process flow for forming air-gap structure 55, overlying substrate 10 and underlying overcoat layer 50 is depicted. Thus a sacrificial layer absent any PAG 15, is formed over substrate 10 as shown (10B). After such layer (film) is dried, PAG monolayer 20 is formed where layer 15 and layer 20 encompass PAG bilayer film 25 (10C). Image-wise exposure of bilayer 25 is then done using mask 30 to define which portions of film 25 will be exposed by actinic radiation 35 (10D). Exposed portions of bilayer 25 are removed via a thermal decomposition process to leave unexposed portions 40 remaining over substrate (10E). Then, as shown in FIG. 11F, overcoat layer 50 is disposed over the structure shown in FIG. 10E, and after heating the structure of FIG. 11F to a temperature appropriate for the decomposition of portions 45 and the permeation of the decompositions products through overcoat 50, airgaps 55 are formed (10G).

As previously discussed, for some embodiments in accordance with the present invention, a PAG unilayer is employed rather than the PAG bilayer discussed above. Such a PAG unilayer was prepared and tested as described in Experiment 2, below.

Experiment 2

A first solution was prepared having 20 wt. % PPC in GBL. This first solution was absent any PAG. A second solution was prepared having 0.6 wt. % PAG in GBL, where the PAG was 4-methylphenyl[4-(1-methylethyl)phenyl]iodonium tetrakis (pentafluorophenyl)borate (Rhodorsil-FABA).

A PPC film was cast from the first solution on a Si substrate. The film was by spin coating the silicon wafer with the first solution at 500 RPM for 5 sec, then ramping the spin speed to 1000 RMP and holding the spin speed at that rate for 40 sec. Then wafer was heated to 105° C. and held at that temperature for 5 min. After cooling the wafer, the thickness of the resulting sacrificial polymer layer was determined to be 10.7 um after.

Then, the sacrificial polymer layer was treated with the second, PAG only solution. The treatment was accomplished by dispensing the second solution over the sacrificial polymer layer using the same spin coating cycle described above followed by heating the treated layer and silicon wafer also as described above.

Visual observation of the sacrificial polymer layer after treatment demonstrated a smooth surface with no visible PAG on the layer's surface. The thickness of the sacrificial polymer layer after treatment with the second solution was determined to be 6.1 um.

Then, the sacrificial polymer layer was exposed to UV radiated (248 nm radiation for 62 sec) and then heated again to 105° C. for 5 minutes. Visual observation of the wafer after the wafer cooled demonstrated that the sacrificial polymer was essentially completely decomposed with only a small amount of residue believed due to the PAG present on the wafer's surface. The residue was a very thin brown, dusty appearing layer which was completely removed with an isopropyl alcohol rinse.

Since, as shown in FIG. 5, a PPC layer without PAG does not begin to exhibit any decomposition below 150° C., the results demonstrated by Experiment 2 demonstrate that treatment of a PPC layer that is absent any PAG in a manner consistent to that described above will incorporate sufficient PAG into the layer to allow for complete decomposition of such treated layer at or below 105° C. within 5 minutes.

While Experiment 2 demonstrates that using the same solvent for each composition provides for incorporation of PAG into the sacrificial polymer layer, it is believed that if the second solution employed a different solvent from the first solution, where the sacrificial polymer exhibited some solubility in such different solvent, the PAG of such second solution will also be incorporated into the sacrificial layer, but where the sacrificial polymer is less soluble in such different solvent the loss of layer thickness will most likely be reduced. One could also imagine other means, such as vapor phase infiltration if the PAG had a sufficient vapor pressure or if such sufficient amount of PAG was contained in the vapor phase of an appropriate solvent. Additionally, it is believed that a PAG could be diffused into a sacrificial polymer layer if brought in contact with such layer, for example by employing as a different solvent for the second solution, a solvent not miscible with the sacrificial polymer so that a thin PAG layer would be formed thereon.

By now it should be realized that a novel method for forming PAG doped sacrificial polymer layers, either as a PAG bilayer or a PAG unilayer, has been demonstrated hereinabove. Further, it should be understood that PAG bilayers and PAG unilayers can be used to form structures such as air cavities, fluidic channels, microelectromechanical system (MEMS) devices and packaging, low-K dielectric structures for advanced microelectronic devices and the like that because of the enhanced imageability and improved line edge roughness that have been demonstrated herein are capable of extending the usage of such structures to sub-micro and nano-scale devices using well known fabrication methodology.

The invention claimed is:

1. A bilayer structure for use in an electronic device comprising:
   a first polymer layer formed overlying a substrate, said layer consisting of at least a sacrificial polymer;
   a second polymer layer formed overlying said first polymer layer, said second layer consisting of at least said sacrificial polymer and a photoacid generator;
   where the second polymer layer comprises a concentration gradient of said photoacid generator; and
   said bilayer structure used to form an air gap structure for use in the electronic device.

2. The bilayer structure of claim 1 where the first polymer layer has a thickness in the range of 17.9 µm to 28.5 µm.

3. The bilayer structure of claim 1 where the second polymer layer has a thickness in the range of 1.4 µm to 5.6 µm.

4. The bilayer structure of claim 1 where the bilayer structure is used to form a plurality of air gaps for use in the electronic device.

5. The bilayer structure of claim 1 where the concentration of the photoacid generator is from 2 weight percent of the polymer to 10 weight percent of the polymer.

6. The bilayer structure of claim 1 which further comprises a third sacrificial polymer layer overlying said second layer, where said third layer is either absent a concentration of a photoacid generator or has a photoacid generator loading of from 0.5 weight percent of the polymer to 20 weight percent of the polymer.

7. The bilayer structure of claim 1 where the first and second layers are formed from a sacrificial polymer composition comprising a solvent.

8. The bilayer structure of claim 7 where the solvent is selected from isopropyl alcohol, gamma-butyrolactone, N-methyl pyrrolidone, anisole, propylene glycol methyl ether acetate, and combinations thereof.

9. The bilayer structure of claim 1 where said air-gap structure is substantially free of residue.

10. The bilayer structure of claim 1 where said first and second polymer layers combined has a thickness in the range of 0.1 µm to 300 µm, inclusive.

11. The bilayer structure of claim 1 where said second polymer layer has a thickness lesser than the thickness of the first layer.

12. The bilayer structure of claim 1 where said first and second polymer layers are formed from a polycarbonate selected from a polypropylene carbonate, polyethylene carbonate, polycyclohexane carbonate, polycyclohexanepropylene carbonate, polynorbornene carbonate, and combinations thereof.

13. The bilayer structure of claim 1 where said first and second polymer layers are formed from polypropylene carbonate.

14. The bilayer structure of claim 1 where said first and second polymer layers are formed from polyethylene carbonate.

15. The bilayer structure of claim 1 where said first and second polymer layers are formed from polycyclohexane carbonate.

16. The bilayer structure of claim 1 where said first and second polymer layers are formed from polycyclohexanepropylene carbonate.

17. The bilayer structure of claim 1 where said first and second polymer layers are formed from polynorbornene carbonate.

18. The bilayer structure of claim 1 where said first and second polymer layers are formed from a combination of polypropylene carbonate and polyethylene carbonate.

19. The bilayer structure of claim 1 where said sacrificial polymer is from 1 to 50 wt. % of the layer, and where the photoacid generator is from 0.5 to 10 wt. % of the polymer layer.

* * * * *